United States Patent

Althaus et al.

[11] Patent Number: 5,833,748
[45] Date of Patent: Nov. 10, 1998

[54] METHOD OF AND APPARATUS FOR OBTAINING FISSURE-FREE CRYSTALS

[75] Inventors: Martin Althaus, Jülich; Eckhard Küssel, Düren; Klaus Sonnenberg, Niederzier, all of Germany

[73] Assignee: Forschungszentrum Julich GmbH, Julich, Germany

[21] Appl. No.: 737,088
[22] PCT Filed: May 12, 1995
[86] PCT No.: PCT/DE95/00667
  § 371 Date: Oct. 29, 1996
  § 102(e) Date: Oct. 29, 1996
[87] PCT Pub. No.: WO95/31591
  PCT Pub. Date: Nov. 23, 1995

[30] Foreign Application Priority Data
May 16, 1994 [DE] Germany .................. 44 17 105.6

[51] Int. Cl.⁶ .................................................. C30B 15/00
[52] U.S. Cl. .................. 117/49; 117/3; 117/900; 117/915; 117/73
[58] Field of Search .................. 117/900, 915, 117/3, 953, 49, 73, 81, 82

[56] References Cited

U.S. PATENT DOCUMENTS

| | | | |
|---|---|---|---|
| 4,374,391 | 2/1983 | Camlibel | 428/428 |
| 4,478,675 | 10/1984 | Akai | 117/17 |
| 4,609,530 | 9/1986 | Morioka | 148/33 |
| 4,863,554 | 9/1989 | Kawasaki | 117/3 |
| 4,867,785 | 9/1989 | Keem | 148/3 |
| 4,999,082 | 3/1991 | Kremer | 117/83 |
| 5,219,632 | 6/1993 | Shimakura | 148/84 |

Primary Examiner—Robert Kunemund
Assistant Examiner—Evelyn Defilló
Attorney, Agent, or Firm—Herbert Dubno

[57] ABSTRACT

A process and an apparatus for obtaining unfissured crystals of GaAs after the crystal has been formed by direction solidification from a melt in a quartz crucible. The quartz crucible is immersed in molten potassium hydroxide or sodium hydroxide at a temperature of 450° to 600° C.

7 Claims, 2 Drawing Sheets

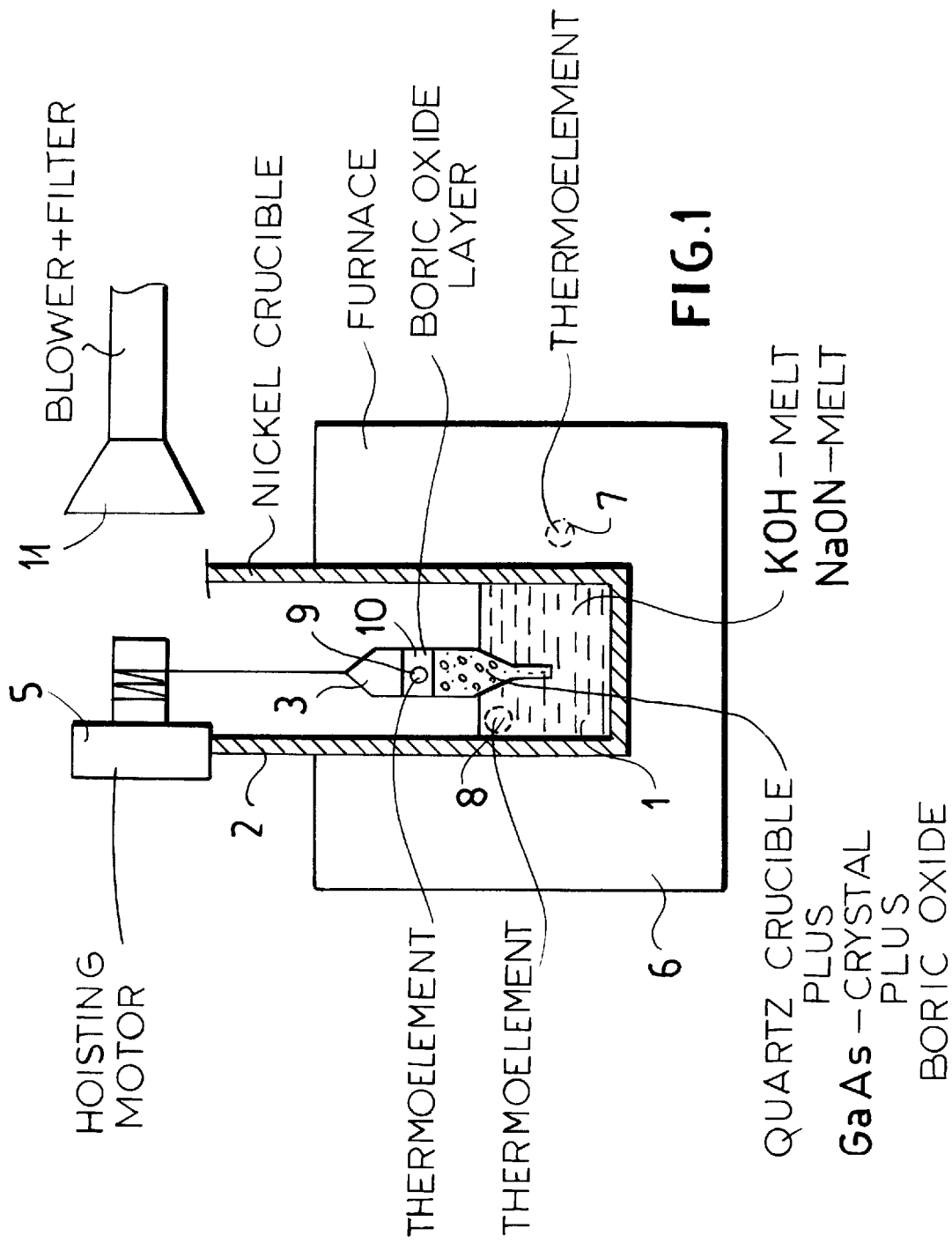

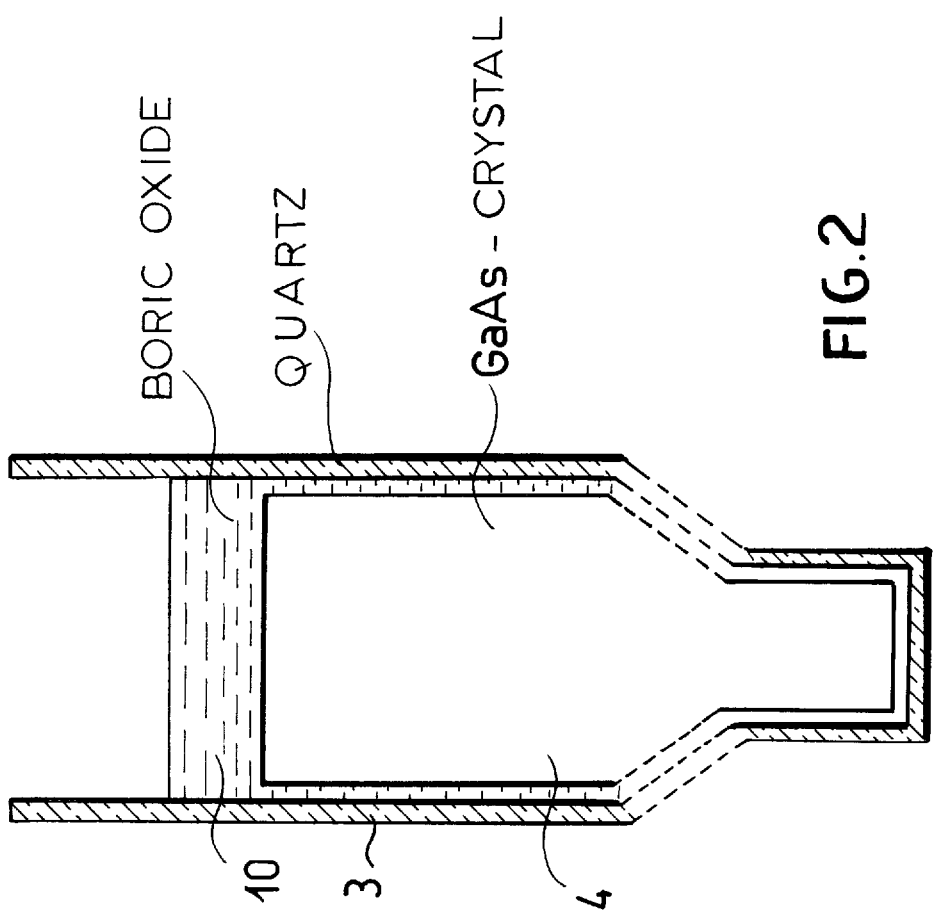

METHOD OF AND APPARATUS FOR OBTAINING FISSURE-FREE CRYSTALS

CROSS REFERENCE TO RELATED APPLICATION

This application is a national stage of PCT/DE95/00667 filed 12 May 1995 and is based upon German national application P4417105.6 of 16 May 1994 under the International Convention.

FIELD OF THE INVENTION

The invention relates to a method of obtaining fissure-free crystals in which the crystal is formed by a directional solidification from a melt in a quartz crucible and the crystal and crucible are at a temperature above about 300° C. The invention relates also to an apparatus for carrying out the method.

BACKGROUND OF THE INVENTION

The semiconductive material gallium arsenide (GaAs) belongs to the group of III/V semiconductors and has by comparison with the classical semiconductor silicon, several interesting physical characteristics. These are, above all, the semi-insulating character of the GaAs, the direct band transition and the high mobility.

The economic significance of this material resides in the high potential for use in opto-electronics and high frequency technology which support the increasing demands of information handling systems.

Concrete uses in the form of LEDs, lasers, microwave diodes and solar cells usually use highly doped and thus conducting monocrystalline wafers.

An important precondition for an industrial use of the III/V semiconductor technology is the improvement of the III/V semiconductor technology by the improvement of GaAs substrate production and the increase in the reliability thereof so that, with respect to this goal, research in the field of crystal growth has been expanded.

At present the most widespread process in industry is the Czochralski process. Its use is based to a large measure on the significant involvement of this process in silicon crystal growth. With GaAs growth, however, other processes give better results. Crystals which are grown by the vertical Bridgman process (VB) have a reduced defect density by a factor of 10, whereby because of the potential automatabilty of this process it offers the possibility of low cost production.

The necessary conditions for carrying out the growth of the monocrystal by the VB process in a crucible are tied to the problem of contacting the melt with the crucible material. This contacting is avoided by the total liquid encapsulation so that the crystal grows quasi-crucible free. Quartz glass is used as a crucible material. The wetting liquid is boric oxide.

Crystals grown in a quartz crucible, apart from GaAs, include indium phosphate and others which have significant tendency to polygrowth and to twinning by comparison to crystals grown in pyrolytic boron nitride crucibles. The yield of monocrystalline GaAs can be sharply increased with this crucible material and thus the economics of the VB process can be increased.

The quartz crucible has, however, the drawback that the crystals form fissures during the cooling process upon the solidification of the boron oxide. These conditions result from the different thermal coefficients of expansion of the quartz glass and the GaAs. The fissures form in crystals which are initiated to a greater extent at temperatures below the 300° C. boundary and occur in the softening zone of boric oxide known from the literature which extends from about 325° C. until about the melt temperature (450° C.).

OBJECTS OF THE INVENTION

It is therefore an object of the invention to provide a process which enables a fissure-free production of a drawn crystal.

It is also an object of the invention to provide an apparatus for carrying out the process.

SUMMARY OF THE INVENTION

These objects are attained in accordance with the invention in that a quartz crucible is immersed in a melt of a silicate-forming hydroxide compound which is at a temperature of about 450° TO 600° C. for its destruction.

It has been found that the destruction of the crucible enables fissure-free crystals to be obtained. This destruction must occur above the hardening point of the boron oxide and thus in the given temperature range.

As the hydroxide compound, for example, NaOH or KOH are used, both substances having the same cost level.

Both substances have a melting point in the 300°–400° C. range (NaOH=318.4° C., KOH=360.4° C.) and a vaporization temperature above the melting temperature of GaAs (NaOH=1390° C., KOH=1322° C.). They are thus best suitable for a decomposition of the quartz glass at about 500° C.

With both substances, indicate it has been found that decomposition of the quartz glass is most effective when the glass is covered by the melt. A decomposition of the glass through the gas phase over the melt is also observable but the experiments indicate that this reaction is temperature dependent. From the standpoint of a uniform decomposition of the crucible, a direct decomposition of the crucible should be carried out in a salt melt.

Both hydroxides destroy a crucible with a wall thickness of 2 mm in a short time period of about one hour whereby the KOH has a greater reaction velocity by a factor of 2. With the quantities of materials used in the tests, ablation speeds of about 3 mm/hour at a temperature of about 500° C. can also be observed. The silicate-forming reaction can be described as follows:

$$2\ KOH + SiO_2 \rightarrow K_2SiO_3 + H_2O.$$

The silicate can be recognized later as the bottom product in the vessel in which the KOH melt was provided.

The boric oxide reacts with a hydroxide melt to toxic borates which can be subjected to hydratization. Since the boric oxide at a temperature of about 500° C. can also be hydrated in the form of metaboric acid, the following reactions with the KOH melt are possible:

$$3\ B_2O_3 + 6\ KOH \rightarrow 2\ K_3B_3O_6 + 3\ H_2O$$

$$3\ HBO_2 + 3\ KOH \rightarrow K_3B_3O_6 + 3\ H_2O$$

in an experiment, regions above the melt were observed which were self-igniting or pyrophoric. These can contain either boranes which are self-igniting in the air or released hydrogen, both reactions being unexpected from the chemicals used.

By the immersion of a thermo-element in the boric oxide cover on the GaAs crystal, it can be determined that the above reaction is strongly exothermic. Temperature increases of about 200° C. per minute are registered by the thermo-element although it is not clear whether the borate formation or a possible hydrating is reacting strongly exothermically.

To obtain a fissure-free GaAs crystal, it must also be ensured that the possible reaction of the boric oxide in the hydroxide melt does not give rise to a deterioration of the crystal solution processes with larger amounts of boric acid. Higher quantities of boric acid give both a stronger exothermic character as well as a higher tendency to gas ignition above the melt so that the strong heating is primarily from the borate formation. To avoid a thermal shock with the crystal to be dissolved as a consequence of a high temperature gradient, it is advantageous to immerse the quartz crystal periodically in the melt and to withdraw it from the melt. The immersion thus should amount to about 5 to 10 seconds.

The effect of the salt melt on the GaAs itself is determined for example in the case of KOH by two parameters: the magnitude of the ablation rate of the GaAs by the melt and the magnitude of the diffusion of the potassium ions in the crystal.

From the investigation of the disassociation density with KOH, it is known that KOH attacks GaAs only slowly so that from this aspect no insoluble manipulation problems arise. GaAs reacts as follows with the KOH melt:

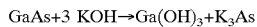

$$GaAs + 3\ KOH \rightarrow Ga(OH)_3 + K_3As$$

The tests carried out later with crystals grown in quartz glass confirm these expectations.

The diffusion of potassium in the crystal does not pose any insoluble problem. A diffusion process with a gaussian density distribution supplies an estimate of the expected standard deviation $\sigma = \sqrt{(2Dt)}$ with the aid of the diffusion constant of the isoelectronic lithium of $10^{-6} cm/s^2$ in the size range of 0.85 mm. An exposure of one hour was used which corresponded to the approximate residence time of the crystal in the KOH melt. It is, however, to be noted that the Ga is liberated from the melt when the quartz glass is decomposed and the boric oxide layer is penetrated and that no elemental potassium arises. Finally the following summary can be given.

The cited hydroxide compounds especially are of low cost and enable a rapid decomposition of the crystal material whereby KOH shows a greater ablation rate than NaOH.

An uncontrolled decomposition of the GaAs crystals by the KOH melt is not observed.

The potassium does not change the electrical characteristics of the conducting bulk material.

For carrying out the process of the invention, an apparatus is suitable which has been characterized substantially as a heatable container which is provided to receive a melt of a hydroxide compound, and a lifting device for immersing and withdrawing the quartz crucible from the melt.

Advantageously, a suction device is provided for drawing off gases from above the quartz crucible.

To carry out the periodic immersion process, a control device is further provided for the lifting unit which periodically immerses the quartz crystal in the melt and draws it out of the latter.

BRIEF DESCRIPTION OF THE DRAWING

The above and other objects, features, and advantages will become more readily apparent from the following description, reference being made to the accompanying drawing in which:

FIG. 1 is a diagrammatic section through a device for practicing the invention; and FIG. 2 is a diagrammatic section through a crucible showing the crystal and boric acid.

SPECIFIC DESCRIPTION

As will be apparent from FIG. 1, the melt 1 is contained in an open vessel 2 in which the quartz crucible 3 with the crystal 4 (FIG. 2) can be immersed in the melt by means of a lifting motor 5. This vessel is composed of nickel which is resistant to the KOH melt. For decomposition of the crucible in a closed vessel with corresponding safety provisions, a carbon charge can also be used.

For the temperature regulation, three thermoelements are employed.

The first thermo-element 7 measures the temperature in the heating furnace 6 itself; the second thermoelement 8 measures the temperature in the melt and the third thermo-element 9 measures the temperature in the boric oxide layer 10 which reacts strongly exothermically with the KOH melt.

Temperature shocks in the crystal as a consequence of the exothermic reaction are avoided in that the crucible is withdrawn from the melt immediately and thus the reaction with the KOH melt is halted. This periodic immersion process can naturally be automated.

Possible gaseous contaminants are drawn off with the aid of a blower plus filter 11 also.

From FIG. 2 it is apparent that the crystal in the quartz crucible is completely surrounded by boric oxide.

We claim:

1. A process for recovering fissure-free crystals in which the crystals are formed by directional solidification from a melt in a quartz crucible and the crystal and crucibles are still at a temperature above about 300° C., comprising immersing the quartz crucible for the decomposition thereof in a melt of a silicate-forming hydroxide compound which is at a temperature of about 450° to 600° C.

2. The process according to claim 1 wherein the hydroxide compound is KOH.

3. The process according to claim 1 wherein the quartz crystal is periodically immersed in the melt and withdrawn therefrom.

4. The process according to claim 3 wherein the immersion phase amounts to about 5 to 10 seconds.

5. An apparatus for carrying out a process for recovering fissure-free crystals in which the crystals are formed by directional solidification from a melt in a quartz crucible and the crystal and crucibles are still at a temperature above about 300° C., comprising immersing the quartz crucible for the decomposition thereof in a melt of a silicate-forming hydroxide compound which is at a temperature of about 450° to 600° C., said apparatus comprising a heatable vessel is provided for the melt of said hydroxide compound, and a lifting device for immersion of the quartz crucible in and for removal from the melt.

6. The apparatus according to claim 5 wherein a suction unit is provided for drawing off the gas above the quartz crucible.

7. The apparatus according to claim 5 wherein a control device is provided for the lifting unit which periodically immerses the quartz crystal in and withdraws it from the melt.

* * * * *